US008481173B2

(12) United States Patent
Ragini et al.

(10) Patent No.: US 8,481,173 B2
(45) Date of Patent: Jul. 9, 2013

(54) ORGANOMETALLIC COMPLEX AND ORGANIC ELECTROLUMINESCENCE DEVICE USING THE SAME

(75) Inventors: Das Rupasree Ragini, Suwon-si (KR); Hee-Kyung Kim, Anyang-si (KR); O-Hyun Kwon, Seoul (KR); Myeong-Suk Kim, Suwon-si (KR); Shinichiro Tamura, Seongnam-si (KR); Jong-Jin Park, Yongin-si (KR); Che-Un Yang, Suwon-si (KR); Yi-Yeol Lyu, Yongin-si (KR); Young-Hun Byun, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 883 days.

(21) Appl. No.: 11/640,289

(22) Filed: Dec. 18, 2006

(65) Prior Publication Data

US 2007/0196689 A1      Aug. 23, 2007

(30) Foreign Application Priority Data

Feb. 20, 2006    (KR) .................. 10-2006-0016278

(51) Int. Cl.
*H01L 51/54*     (2006.01)
*C09K 11/06*     (2006.01)

(52) U.S. Cl.
USPC ........... 428/690; 428/917; 313/504; 313/506; 257/40; 257/E51.044; 544/225; 246/4; 246/10; 548/108

(58) Field of Classification Search
None
See application file for complete search history.

(56) References Cited

U.S. PATENT DOCUMENTS

| 6,936,716 | B1 | 8/2005 | Lin | |
|---|---|---|---|---|
| 2001/0019782 | A1 | 9/2001 | Igarashi et al. | |
| 2003/0152802 | A1* | 8/2003 | Tsuboyama et al. | 428/690 |
| 2004/0124766 | A1* | 7/2004 | Nakagawa et al. | 313/504 |
| 2004/0249157 | A1 | 12/2004 | Guram et al. | |
| 2005/0119485 | A1* | 6/2005 | Brown et al. | 546/2 |
| 2005/0175860 | A1* | 8/2005 | Kim et al. | 428/690 |
| 2005/0287391 | A1 | 12/2005 | Chang et al. | |
| 2007/0176542 | A1 | 8/2007 | Ragini et al. | |
| 2007/0178332 | A1 | 8/2007 | Ragini et al. | |

FOREIGN PATENT DOCUMENTS

| CN | 1474826 A | 2/2004 |
|---|---|---|
| CN | 1626540 A | 6/2005 |
| JP | 2001-247859 A | 9/2001 |
| JP | 2004-174838 | 6/2004 |
| JP | 2005-200416 | 7/2005 |
| KR | 10-2006-0000776 A | 1/2006 |

OTHER PUBLICATIONS

M. A. Baldo et al., "Excitonic singlet-triplet ratio in a semiconducting organic thin film", Physical Review B, vol. 60, No. 20, pp. 14 422-140428, Nov. 15, 1999.
M. A. Baldo et al., "Highly efficient phosphorescent emission from organic electroluminescent devices", Nature, vol. 395, Sep. 10, 1998, pp. 151-154.
F. O. Garces et al., "Synthesis, Structure, Electrolchemistry, and Photophysics of Methyl-Substituted Phenylpyridine Ortho-Metalated Iridium(III) Complexes", Inorg. Chem. 1988, 27, 3464-3471.
S. Sprouse, et al., "Photophysical Effects of Metal-Carbon a Bonds in Ortho-Metalated Complexes of Ir(III) and Rh(III)", J. Am. Chem. Soc. 1984, 106, 6647-6653.
Chinese Office Action issued by Chinese Patent Office on Jan. 26, 2011 corresponding to Korean Patent Application No. 2006-0016278 and Request for Entry of the Accompanying Office Action attached herewith.
Japanese Office action issued by Japanese Patent Office on Jul. 31, 2012 in the examination of the Japanese Patent Application No. 2007-036903 and Request for Entry attached herewith.
Slater, Jonathatn W. Rourke Jonathan P., Cyclometalated nitrogen heterocycles, Journal of Organometallic Chemistry, 2003, 668(1-2), 112-120; which was cited in the Japanese Office action issued by Japanese Patent Office on Jul. 31, 2012 in the examination of the Japanese Patent Application No. 2007-036903.
Xu, Maoliang, Li, Wenlian, An, ZhongWei, Zhou, Qun, Wang, Geyang, Crystal structure of iridium (III) bis (2-(p-biphenylyl) quinolyl-N, C2') acetylacetonate, (bpq) 21r(acac), X-Ray Structure Analysis Online, 2005, 21(11), x185-186 which was cited in the Japanese Office action issued by Japanese Patent Office on Jul. 31, 2012 in the examination of the Japanese Patent Application No. 2007-036903.

* cited by examiner

*Primary Examiner* — Jennifer A Chriss
*Assistant Examiner* — Andrew K Bohaty
(74) *Attorney, Agent, or Firm* — Robert E. Bushnell, Esq.

(57) ABSTRACT

Provided are an organometallic complex providing highly efficient phosphorescence and an organic electroluminescence device using the organometallic complex represented by Formula 1: $ML_mL'_n$ where M is Ir, Os, Pt, Pb, Re, Ru or Pd, L and L' are different bidentate ligands, m is 1, 2 or 3, and n is 3−m. The organometallic complex can be used to form an organic layer of the organic electroluminescence device, efficiently emits light of a wavelength corresponding to red light, and has high brightness and low operating voltage.

13 Claims, 2 Drawing Sheets

ORGANOMETALLIC COMPLEX AND ORGANIC ELECTROLUMINESCENCE DEVICE USING THE SAME

CROSS-REFERENCE TO RELATED PATENT APPLICATION AND CLAIM OF PRIORITY

This application claims the benefit of Korean Patent Application No. 10-2006-0016278, filed on Feb. 20, 2006, in the Korean Intellectual Property Office, the disclosure of which is incorporated herein in its entirety by reference.

BACKGROUND OF THE INVENTION

1. Field of the Invention

The present invention relates to an organometallic complex and an organic electroluminescence device, and more particularly, to an organometallic complex enabling red light emission and an organic electroluminescence device including an organic layer formed of the organometallic complex.

2. Description of the Related Art

Organic electroluminescent (EL) devices, which are active display devices, use the recombination of electrons and holes in a fluorescent or phosphorescent organic compound thin layer (hereinafter, referred to as 'organic layer') to emit light when current is applied thereto. Organic electroluminescent devices are lightweight, have wide viewing angles, produce high-quality images, and can be manufactured using simple processes. Organic electroluminescent devices also can produce moving images with high color purity while having low consumption power and low voltage. Accordingly, organic electroluminescent devices are suitable for portable electronic applications.

In general, an organic electroluminescent device includes an anode, a hole transport layer, an emission layer, an electron transport layer, and a cathode sequentially stacked on a substrate. The hole transport layer, the light emitting layer, and the electron transport layer are organic layers formed of organic compounds. The organic electroluminescent device may operate as follows. When a voltage is applied between the anode and the cathode, holes emitted by the anode move to the light-emitting layer via the hole transport layer. Electrons are emitted by the cathode and move to the light-emitting layer via the electron transport layer. In the light-emitting layer, the carriers recombine to produce excitons. The excitons radiatively decay, emitting light corresponding to a band gap of the material used to form the light-emitting layer.

Materials that can be used to form the light-emitting layer of the organic electroluminescent device are divided, according to the emission mechanism, into fluorescent materials using singlet excitons and phosphorescent materials using triplet-state excitons. The light-emitting layer is formed by such fluorescent materials or phosphorescent materials themselves or by doping such fluorescent materials or phosphorescent materials with appropriate host materials. When electrons are excited, singlet excitons and triplet excitons are generated in a host in the generation ratio of 1:3 (Baldo, et al., Phys. Rev. B, 1999, 60, 14422).

When fluorescent materials are used to form the light-emitting layer in the organic electroluminescent device, triplet excitons that are generated in the host cannot be used. However, when phosphorescent materials are used to form the light emitting layer, both singlet excitons and triplet excitons can be used, and thus, an internal quantum efficiency of 100% can be obtained (see Baldo et al., Nature, Vol. 395, 151-154, 1998). Accordingly, the use of phosphorescent materials brings higher light emitting efficiency than use of fluorescent materials.

When a heavy metal, such as Ir, Pt, Rh, or Pd is included in an organic molecule, spin-orbital coupling occurs due to a heavy atom effect, and thus, singlet states and triplet states become mixed, allowing forbidden transitions to occur and thus effectively emitting phosphorescent light even at room temperature.

As described above, transition metal compounds that include a transition metal such as Iridium (Ir) and platinum (Pt) have been developed to provide highly efficient phosphorescent materials that use a phosphorescence effect. However, development of red phosphorescent materials for full-color display devices is still required.

SUMMARY OF THE INVENTION

The present invention provides an organometallic complex, which can efficiently emit light of a wavelength corresponding to red light.

The present invention also provides an organic electroluminescence device using the organometallic complex.

According to an aspect of the present invention, there is provided an organometallic complex comprising a compound represented by Formula 1:

$$ML_mL'_n \qquad \text{[Formula 1]}$$

where M is Ir, Os, Pt, Pb, Re, Ru or Pd;
L and L' are different bidentate ligands;
m is 1, 2 or 3;
n is 3−m; and
a partial structure, $ML_m$ is represented by Formula 2;

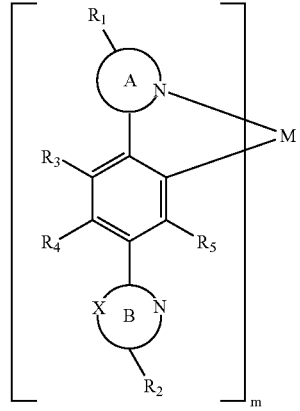

[Formula 2]

where M and m are defined as above;
A and B are each independently a $C_3$-$C_{60}$ heterocyclic group or a heteroaryl group;
X represents C, O, N, or S; and
$R_1$, $R_2$, $R_3$, $R_4$ and $R_5$ are each independently hydrogen, a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group.

M may be one of Ir and Pt.

A and B may be a $C_3$-$C_{60}$ bicyclic or tricyclic aromatic fused ring structure having at least one hetero atom.

According to another aspect of the present invention, there is provided an organic electroluminescence device having an organic layer interposed between a pair of electrodes, the organic layer comprising the organometallic complex described above.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
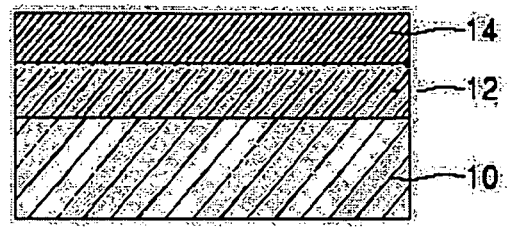
FIGS. 1A through 1F are diagrams schematically illustrating various laminated structures of an organic electroluminescent device according to embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

The present invention provides an organometallic complex comprising a compound represented by Formula 1 which includes a cyclometalating ligand. The ligand in such an organometallic complex reduces an energy gap between highest occupied molecular orbital (HOMO) and triplet metal-to-ligand charge-transfer ($^3$MLCT) state to move a corresponding light emitting wavelength a number of nm towards wavelengths corresponding to red light. Accordingly, emission of red light obtained from triplet MLCT of metal, for example, Ir(III) complex is available in an organic electroluminescent device including the organometallic complex. The organometallic complex comprising compounds represented by Formula 1 or 2 according to an embodiment of the present invention is shown below:

$ML_mL'_n$      [Formula 1]

where M is Ir, Os, Pt, Pb, Re, Ru or Pd;
L and L' are different bidentate ligands;
m is 1, 2 or 3;
n is 3–m; and
a partial structure, $ML_m$ is represented by Formula 2 shown below.

In the organometallic complex of Formula 1, M is a core metal which is combined with L and L', each individually a cyclometalating ligand or an ancillary ligand, for example, Ir, Os, Pt, Pb, Re, Ru or Pd. Preferably, Ir or Pt, more preferably Ir, may be used, but is not limited thereto.

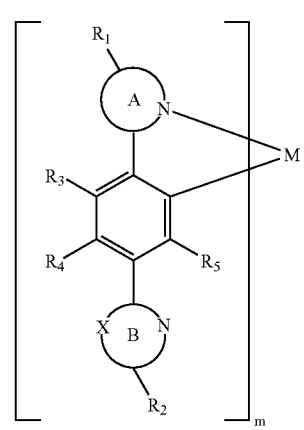

[Formula 2]

where M and m are defined as above;
A and B are each independently a $C_3$-$C_{60}$ heterocyclic group or a heteroaryl group;
X represents C, O, N, or S; and
$R_1$, $R_2$, $R_3$, $R_4$ and $R_5$ are each independently hydrogen, a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group.

Formula 2 represents a partial structure of $ML_m$ of the compound represented by Formula 1 and is a structure of the organometallic complex in which the ancillary ligand, L' is excluded.

A and B in the partial structure of Formula 2 are each independently a heterocyclic group or a heteroaryl group including a nitrogen atom which directly forms a coordinate covalent bond with a core metal, M. The heterocyclic group is a major element that forms a ring and is a substituted or unsubstituted $C_3$-$C_{60}$ heterocyclic group including hetero atoms such as N, O, S and/or P. Examples of the heterocyclic group are pyrrolidine, morpholine, thiomorpholine, thiazolidine, and the like, but are not limited thereto. The heteroaryl group is a major element that forms a ring and is a substituted or unsubstituted $C_3$-$C_{60}$ heteroaryl group including hetero atoms such as N, O, S and/or P. The heteroaryl group includes the fused rings having a tricyclic or a bicyclic structure. Examples of the heterocyclic group are pyridine, 4-methoxypyridine, quinoline, pyrrole, indole, pyrazine, pyrazole, imidazole, pyrimidine, quinazoline, thiazole, oxazole, triazine, 1,2,4-triazole, thiophene, thianthrene, furan, isothiazole, isobenzofuran, isoxazole, pyridine, purine, 4H-quinolizine, isoquinoline, pyridazine, 1H-pyrrolizin, phthalazine, indolizine, 1,8-naphthridine, isoindole, quinoxaline, cinnoline, indazole, pteridine, carbazole, phenazine, phenomercazine, phenanthridine, phenophosphazine, acridine, perimidine, phenothiazine, a functional group of phenoxazine, and the like, but are not limited thereto.

One or more hydrogen in the compound represented by Formula 2 can be substituted with various substituents and examples of the substituents are a halogen atom, —$OR_1$, —$N(R_1)_2$, —$P(R_1)_2$, —$POR_1$, —$PO_2R_1$, —$PO_3R_1$, —$SR_1$, —$Si(R_1)_3$, —$B(R_1)_2$, —$B(OR_1)_2$, —$C(O)R_1$, —$C(O)OR_1$, —C(O)N($R_1$), —CN, —$NO_2$, —$SO_2$, —$SOR_1$, —$SO_2R_1$, and —$SO_3R_1$. Here, $R_1$ is selected from the group consisting of hydrogen, a halogen atom, a substituted or unsubstituted $C_1$-$C_{20}$ alkyl group, a substituted or unsubstituted $C_1$-$C_{10}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{40}$ aryl group, a substituted or unsubstituted $C_7$-$C_{40}$ arylalkyl group, a substituted or unsubstituted $C_7$-$C_{40}$ alkylaryl group, a substituted or unsubstituted $C_2$-$C_{40}$ heteroaryl group, and a substituted or unsubstituted $C_3$-$C_{40}$ heteroarylalkyl group.

m is an integer of 1 to 3 and n is 3−m. m may be preferably 1 or 2 and n may be preferably 1 or 2. More preferably, m may be 2, and n may be 1.

$ML_m$ may be one of the structures represented by Formulas 3 through 9, but is not limited thereto:

[Formula 3]

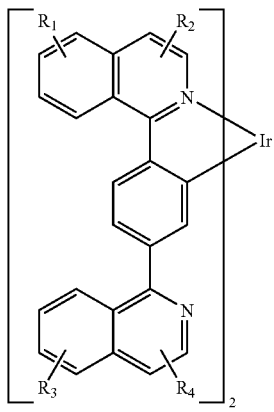

[Formula 4]

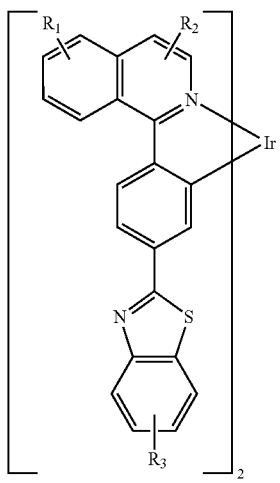

[Formula 5]

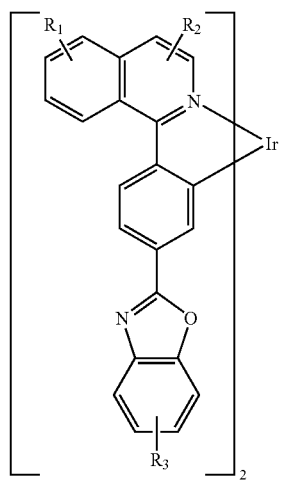

[Formula 6]

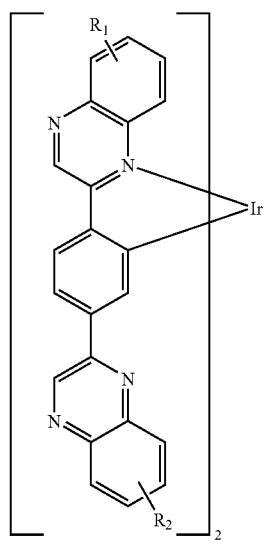

[Formula 7]

[Formula 8]

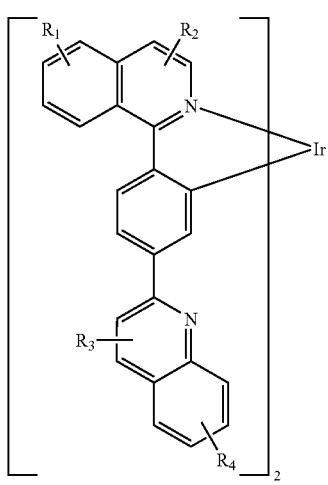

[Formula 9]

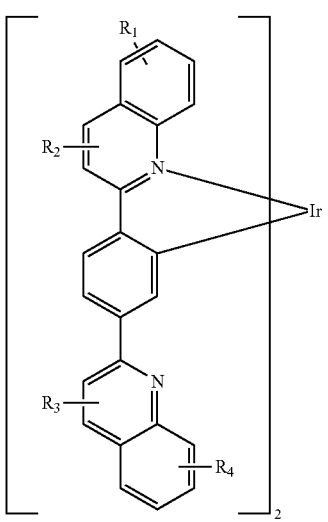

where, $R_1$, $R_2$, and $R_3$ are each independently at least one selected from the group consisting of hydrogen, a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl, a substituted or unsubstituted $C_2$-$C_{20}$ alkynyl, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, and a substituted or unsubstituted $C_3$-$C_{30}$ heteroarylalkyl group.

In the organometallic complex of Formula 1 according to the present invention, L' may be any bidentate ancillary ligand used in conventional organometallic complexes and may be one or more compound represented by Formulas 11 through 19, preferably, Formula 11.

[Formula 11]

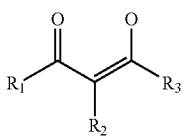

[Formula 12]

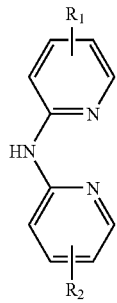

[Formula 13]

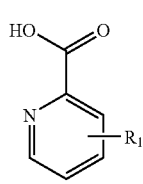

[Formula 14]

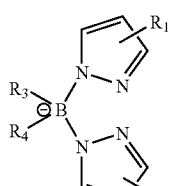

[Formula 15]

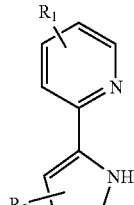

[Formula 16]

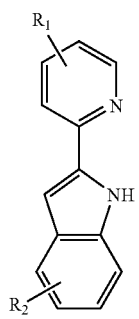

[Formula 17]

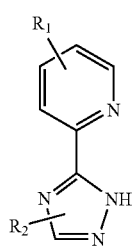

[Formula 18]

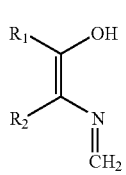

[Formula 19]
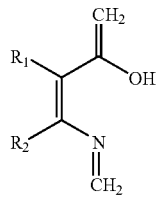

where, $R_1$, $R_2$, $R_3$ and $R_4$ are each independently at least one selected from the group consisting of a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, or a substituted or unsubstituted $C_3$-$C_{30}$ heteroarylalkyl group.

In the bidentate ancillary ligand, L', two unpaired electrons, each existing in the hetero atom, form coordinate valences with the core metal, M and thus, an organometallic complex according to the present invention is formed.

The organometallic complex of Formula 1 according to the present invention may be one of compounds represented by Formulas 21 through 28.

[Formula 21]
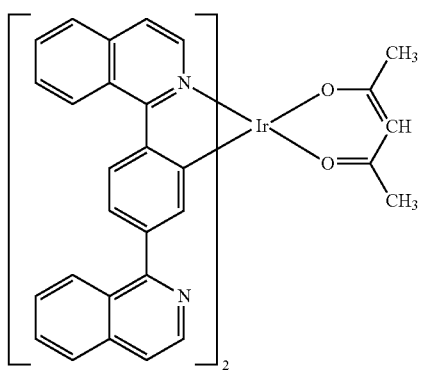

[Formula 22]
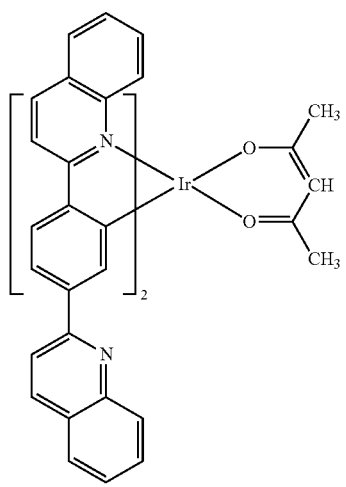

[Formula 23]
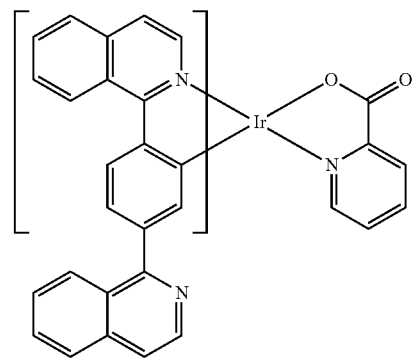

[Formula 24]
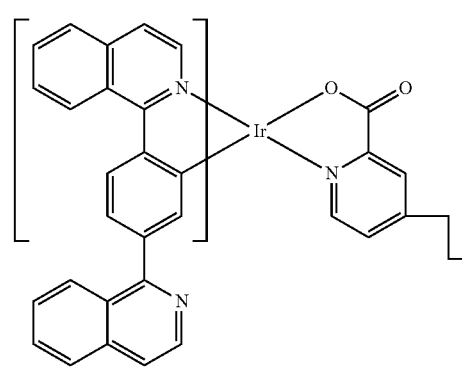

[Formula 25]
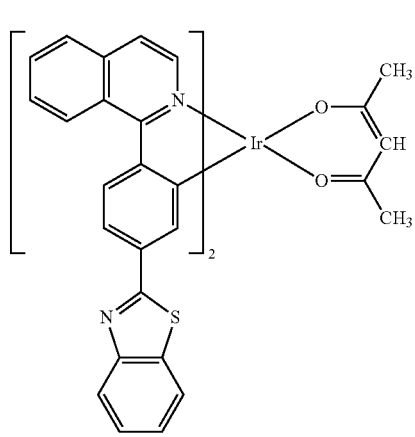

[Formula 26]
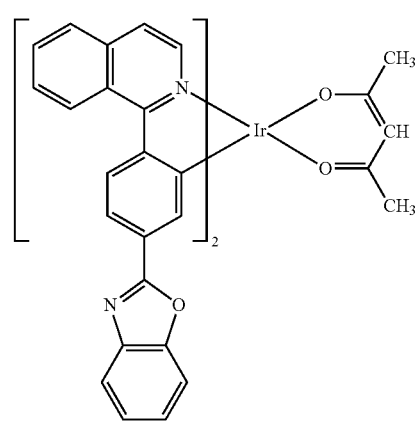

[Formula 27]

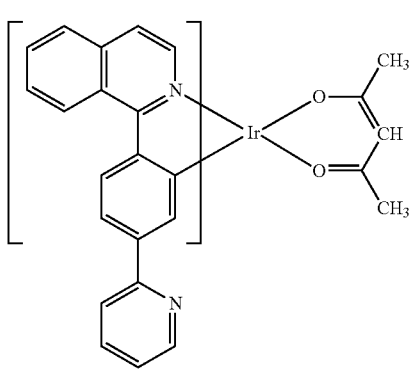

[Formula 28]

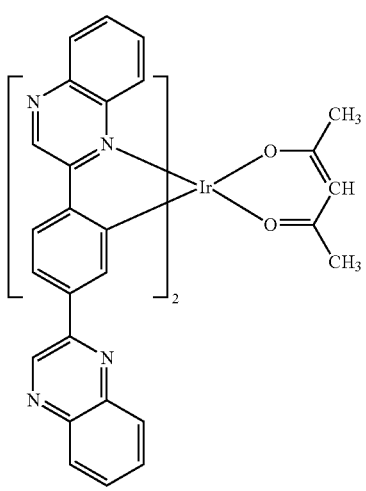

The organometallic complex represented by Formula 1 can be synthesized using a [Ir(CN)$_2$Cl]$_2$ derivative, which is used as a starting material to provide a cyclometalating moiety, and a method disclosed by Watts Group (See F. O. Garces, R. J. Watts, Inorg. Chem. 1988, (27), 3464).

The organic electroluminescence device of the present invention is manufactured by using the organometallic complex represented by Formula 1 to form an organic layer, for example, a light emitting layer. The organometallic complex represented by Formula 1 is suitable as a phosphorescent dopant material for forming a light emitting layer and exhibits excellent light emitting property of light of wavelengths corresponding to red light.

When the organometallic complex represented by Formula 1 is used as the phosphorescent dopant, the organic layer may further include at least one host selected from the group consisting of one or more kinds of a polymer host, a mixture host comprising a polymer and a small molecule, a small molecule host, and a non-emitting polymer matrix. Here, for the polymer host, the small molecule host, and the non-emitting polymer matrix, any materials used conventionally to form light emitting layers of organic electroluminescent devices can be used. Examples of the polymer host are, but are not limited to, poly(vinylcarbazole) (PVK), polyfluorene, and the like. Examples of the small molecule host are, but are not limited to, CBP(4,4'-N,N'-dicarbazole-biphenyl), 4,4'-bis[9-(3,6-biphenylcarbazolyl)]-1,1'-biphenyl, 9,10-bis[(2',7'-t-butyl)-9',9''-spirobifluorenyl anthracene, tetrafluorene, and the like. Examples of the non-emitting polymer matrix are, but are not limited to, polymethylmethacrylate, polystyrene, and the like.

The organometallic complex represented by Formula 1 may be in an amount of 1 to 30 parts by weight based on 100 parts by weight of materials used to form the light-emitting layer. When the amount is below 1 part by weight, phosphorescent materials are insufficient and thus, efficiency and lifetime thereof are reduced. When the amount is above 30 parts by weight, quenching of triplet excitons occurs and thus, efficiency is reduced. In addition, when introducing the organometallic complex to form the light emitting layer, various methods such as vacuum depositing, sputtering, printing, coating, and ink jetting can be used.

Moreover, the organometallic complex represented by Formula 1 may be used together with green phosphorescent materials or blue phosphorescent materials to realize white light.

FIGS. 1A through 1F are diagrams schematically illustrating various laminated structures of an organic electroluminescent (EL) device according to embodiments of the present invention.

Referring to FIG. 1A, an organic electroluminescent device according to an embodiment of the present invention comprises a light emitting layer 12 having a biphenyl derivative of Formula 1 laminated on a first electrode 10 and a second electrode 14 formed on the light emitting layer 12.

Figure 1B:
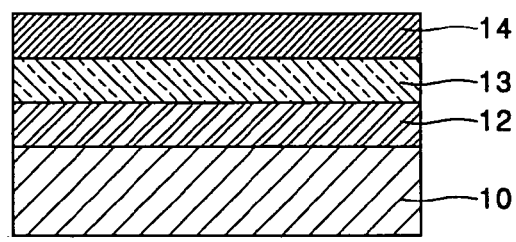

Referring to FIG. 1B, the organic electroluminescent device according to another embodiment of the present invention comprises a light emitting layer 12 having a biphenyl derivative of Formula 1 laminated on a first electrode 10, a hole blocking layer (HBL) 13 laminated on the light emitting layer 12, and a second electrode 14 formed on the HBL 13.

Figure 1C:
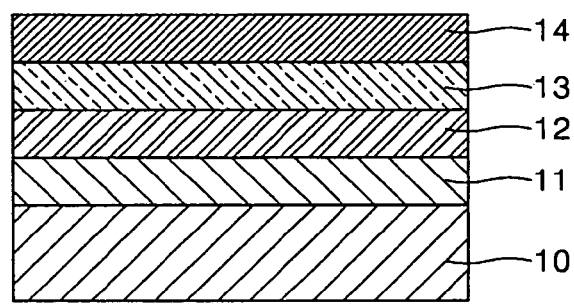

Referring to FIG. 1C, the organic electroluminescent device according to another embodiment of the present invention has the same structure as the embodiment shown in FIG. 1B except that a hole injection layer (HIL) 11 is further formed between the first electrode 10 and the light emitting layer 12.

Figure 1D:
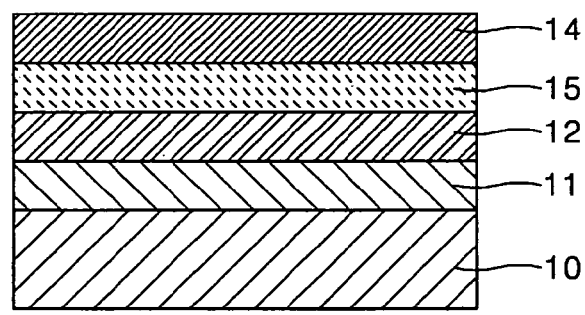

Referring to FIG. 1D, the organic electroluminescent device according to another embodiment of the present invention has the same structure as the embodiment shown in FIG. 1C except that an electron transport layer (ETL) 15 is formed on the light emitting layer 12, instead of the HBL 13.

Figure 1E:
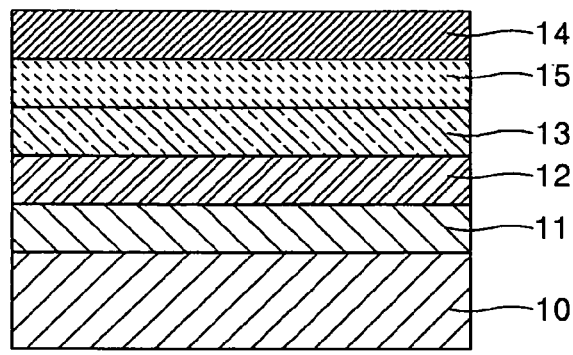

Referring to FIG. 1E, the organic electroluminescent device according to another embodiment of the present invention has the same structure as the embodiment shown in FIG. 1C except that a two-layer which includes the HBL 13 and the ETL 15 instead of the single layered HBL 13 is formed on the light emitting layer 12 having a biphenyl derivative of Formula 1, wherein the HBL 13 and the ETL 15 are sequentially laminated on the light emitting layer 12. In some cases, in FIG. 1E, an electron injection layer may be further formed between the ETL 15 and the second electrode 14.

Figure 1F:
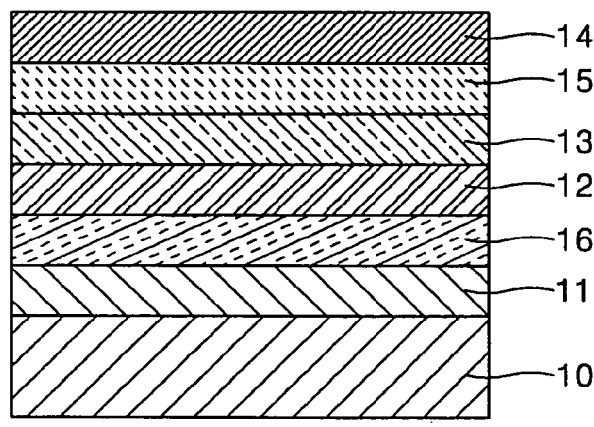

Referring to FIG. 1F, the organic electroluminescent device according to another embodiment of the present invention has the same structure as the embodiment shown in FIG. 1E except that a hole transport layer 16 is further formed between the HIL 11 and the light emitting layer 12. The hole transport layer 16 prevents impurities from penetrating into the light emitting layer 12 from the HIL 11.

The organic EL device having the laminated structures described above may be formed using conventional manufacturing methods, and the structures thereof are not particularly restricted.

The thickness of the organic layer may be in a range of 30 to 100 nm. When the thickness of the organic layer is below 30 nm, efficiency and lifetime thereof are reduced. When the thickness of the organic layer is above 100 nm, operating voltage is increased.

Here, the organic layer refers to a layer formed of organic compounds which is formed between a pair of electrodes in an organic EL device, for example, a light emitting layer, an electron transport layer, and a hole transport layer.

In the organic EL device, a buffer layer may be interposed between the layers. The buffer layer may be formed of any materials used conventionally, for example, copper phthalocyanine, polythiophene, polyaniline, polyacetylene, polypyrrole, polyphenylene vinylene, or the derivatives thereof, but is not limited thereto.

The HTL may be formed of any material used conventionally, for example, polytriphenylamine, but is not limited thereto.

The ETL may be formed of any material used conventionally, for example, polyoxadiazole, but is not limited thereto.

The HBL may be formed of any material used conventionally, for example, LiF, $BaF_2$, or $MgF_2$, but is not limited thereto.

In the manufacture of the organic EL device of the present invention, special equipment and method are not required. The organic EL device can be manufactured according to the conventional manufacturing method using phosphorescent materials.

The organometallic complex of Formula 1 according to the present invention may emit light of a wavelength in the range of 550 to 650 nm.

Light emitting diodes using the organometallic complex can be used in light source illuminations for full-color displays, backlights, external billboards, optical communication, interior decoration, and so on.

The present invention will now be described in greater detail with reference to the following examples. The following examples are for illustrative purposes and are not intended to limit the scope of the invention.

Reference Example 1

Synthesis of 1,4-(isoquinoline)phenyl iridium dimer

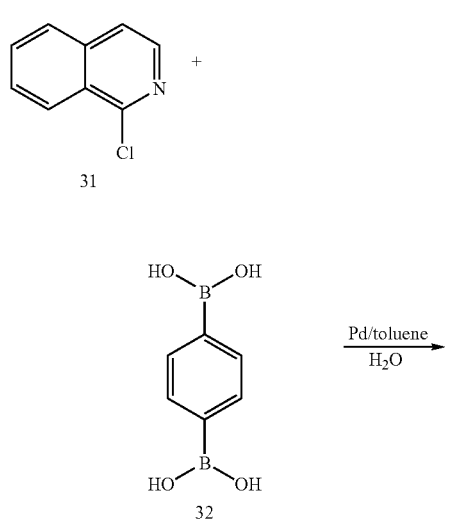

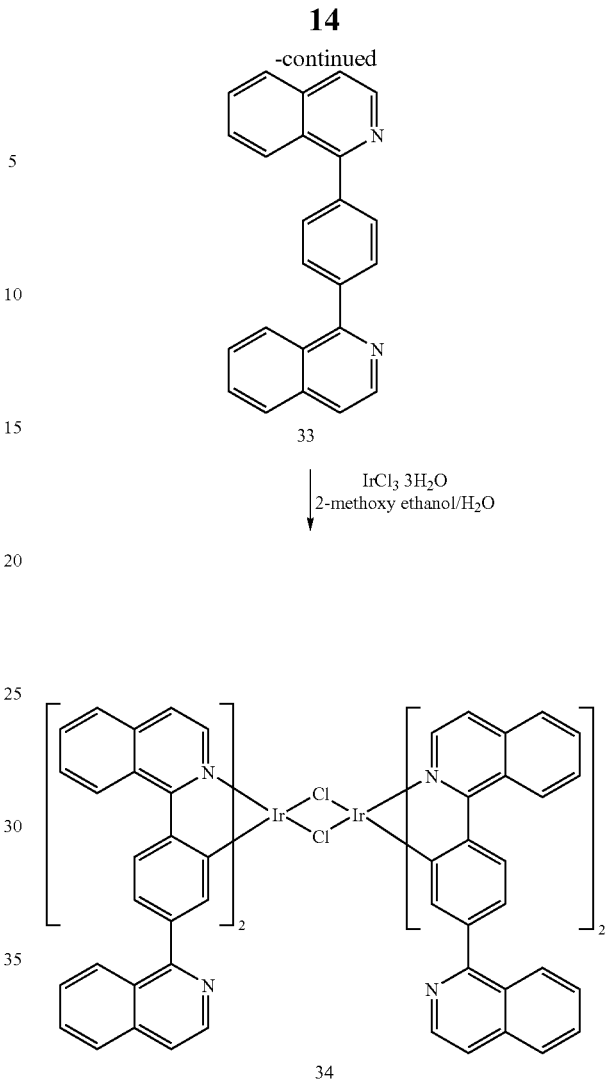

As illustrated in Reaction Scheme 1, a 2M sodium carbonate solution with 40 ml of water, 4 g (24.5 mmol) of 1-chloroisoquinoline of Formula 31, 2.03 g (12.25 mmol) of phenyldiboronic acid of Formula 32, and 80 ml of tetrahydrofuran was added to a 500 ml branched flask and refluxed in a nitrogen atmosphere in complete darkness for 48 hours.

After the reaction was completed, the reaction mixture was adjusted to room temperature and extracted using ethylacetate and water. Then, the extracted resultant was separated using column chromatography (toluene:hexane=10:1) and then 1,4-isoquinolinephenol of Formula 33 was synthesized. The structure of the final product was analyzed using $^1$H NMR spectrum:

$^1$H NMR ($CDCl_3$): 8.68 (d, 1H), 8.24 (d, 1H), 7.93-7.91 (m, 3H), 7.75-7.65 (m, 5H), 7.60-7.52 (m, 3H), 7.50-7.47 (m, 3H).

A 1,4-diisoquinolinebenzene iridium dimer of Formula 34 was prepared using the 1,4-isoquinolinephenol monomer of Formula 33 synthesized according to the above process and $IrCl_3.3H_2O$. In this case, the synthesis method disclosed in J. Am. Chem. Soc., 1984, 106, 6647-6653 was used.

Reference Example 2

Synthesis of 1,4-quinolinephenol iridium dimer

<Reaction Scheme 2>

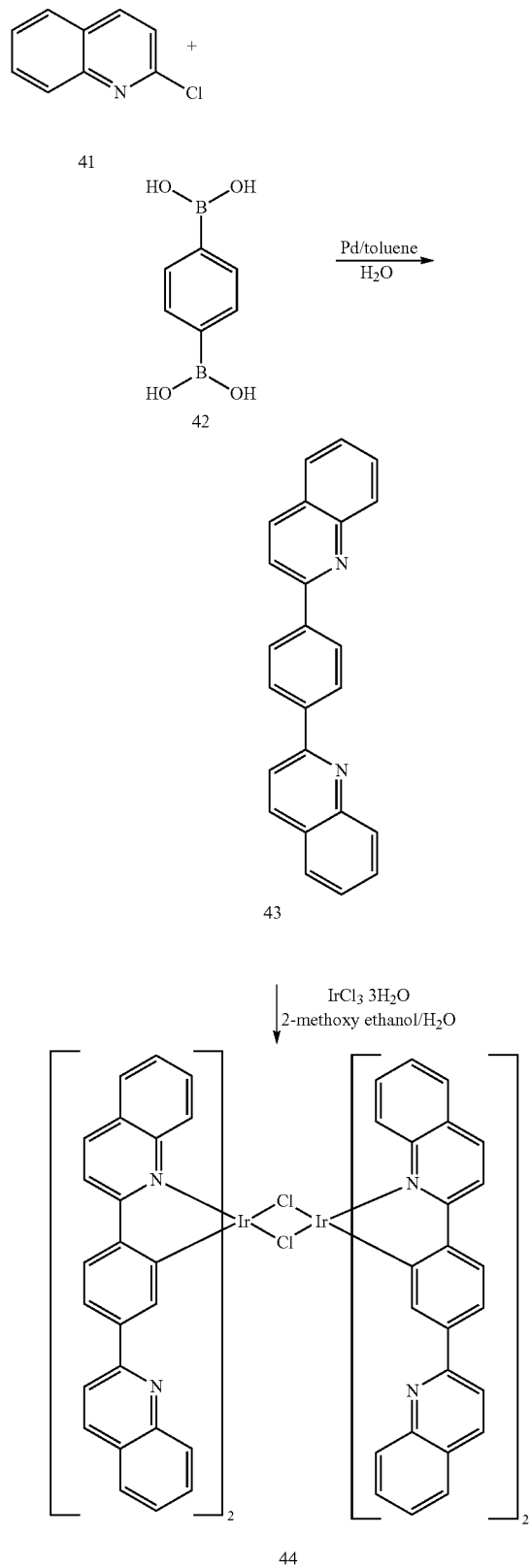

As illustrated in Reaction Scheme 1, a 2M sodium carbonate solution with 40 ml of water 4 g (24.5 mmol) of 1-chloroquinoline of Formula 31, 2.03 g (12.25 mmol) of phenyldiboronic acid of Formula 32, and 80 ml of tetrahydrofuran was added to a 500 ml branched flask and refluxed in a nitrogen atmosphere in complete darkness for 48 hours.

After the reaction was completed, the reaction mixture was adjusted to room temperature and extracted using ethylacetate and water. Then, the extracted resultant was separated using column chromatography (toluene:hexane=10:1) and then 1,4-di-quinolinephenol of Formula 43 was synthesized. The structure of the final product was analyzed using $^1$H NMR spectrum:

$^1$H NMR (CDCl$_3$): 8.35 (s, 2H), 8.22 (dd, 2H), 7.96 (d, 1H), 7.85 (d, 1H), 7.73 (t, 1H), 7.56 (t, 1H).

The result of the $^1$H NMR spectrum shows that the above compound has a symmetrical structure.

A 1,4-diquinolinebenzene iridium dimer of Formula 44 was prepared using the 1,4-di-quinolinephenol monomer of Formula 43 synthesized according to the above process and IrCl$_3$.3H$_2$O.

Example 1

Synthesis of Compound Represented by Formula 21

<Reaction Scheme 3>

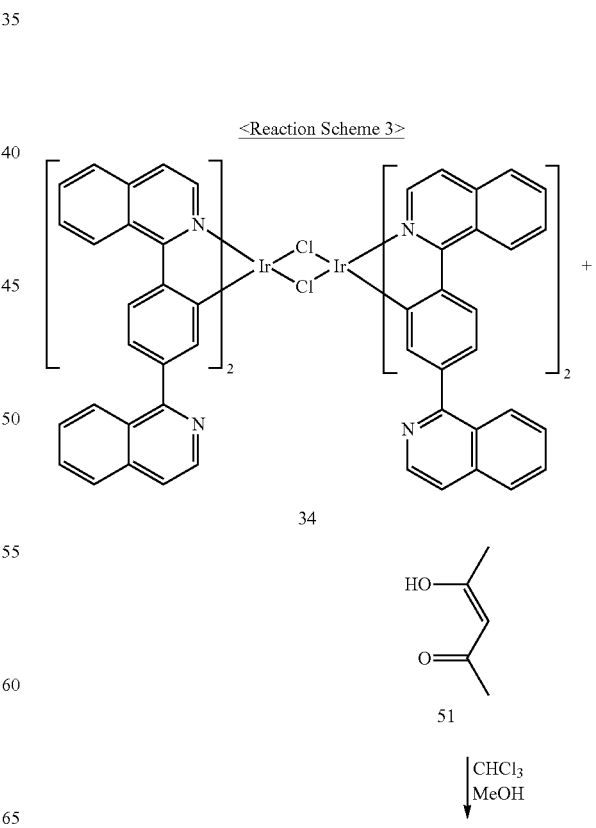

-continued

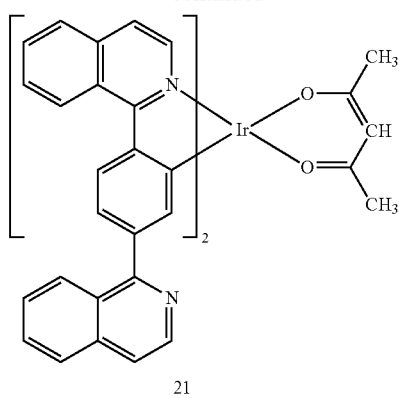

21

As illustrated in Reaction Scheme 3, in a nitrogen atmosphere, 0.1 mmol of [Ir(1,4-di-isoquinolinephenol)$_2$Cl]$_2$ of Formula 34 and 0.25 mmol of acetylacetone of Formula 51 and 2.0 mmol of sodium carbonate were added to a 250 ml branched flask and dissolved in 40 ml of 2-ethoxyethanol to react for 2 to 10 hours at reflux. After the reaction was completed, the reaction solution was celite filtered and precipitated in hexane to obtain deep red powder as the compound represented by Formula 21 in 70% yield. The obtained red solid was refined using silica-gel column (methylene chloride: acetone=10:1). The structure of the final product was analyzed using $^1$H NMR spectrum:

$^1$H-NMR(CDCl$_3$, ppm): 9.05 (d, 1H), 8.5-8.39 (m, 3H), 7.82 (d, 1H), 7.72-7.63 (m, 4H), 7.47-7.37 (m, 4H), 7.16 (t, 1H), 6.80 (s, 1H), 5.23 (s, 1H), 1.79 (s, 3H).

Example 2

Synthesis of Compound Represented by Formula 22

<Reaction Scheme 4>

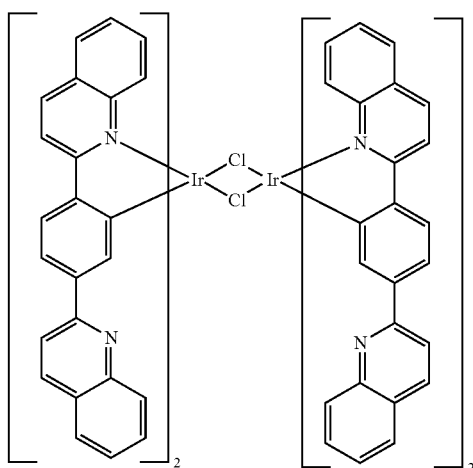

44

-continued

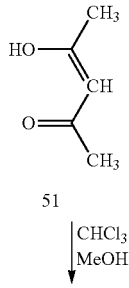

51

| CHCl$_3$
| MeOH

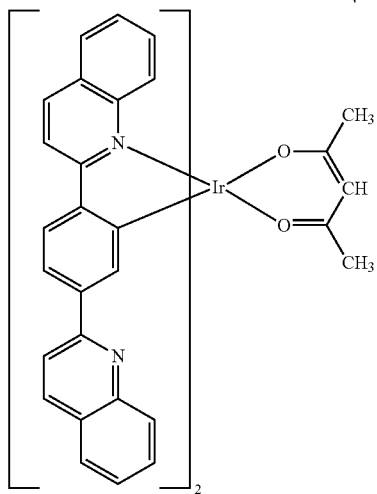

22

As illustrated in Reaction Scheme 4, the compound represented by Formula 22 was synthesized in the same manner as in Example 1, except that 1,4-diquinolinebenzene iridium dimer of Formula 44 was used instead of 1,4-isoquinolinephenol iridium dimmer of Formula 34. The structure of the final product was analyzed using $^1$H NMR spectrum:

$^1$H-NMR(CDCl$_3$, ppm): 8.57 (d, 1H), 8.23 (dd, 2H), 8.03 (d, 1H), 7.99 (d, 1H), 7.88-7.83 (m, 4H), 7.63 (dd, 2H), 7.63 (dd, 2H), 7.50-7.41 (m, 2H), 7.15 (d, 2H), 4.68 (s, 1H), 7.62 (s, 3H).

Example 3

Synthesis of Compound Represented by Formula 23

<Reaction Scheme 5>

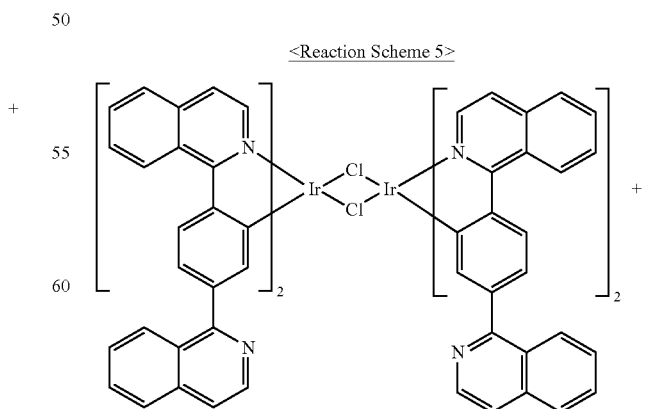

34

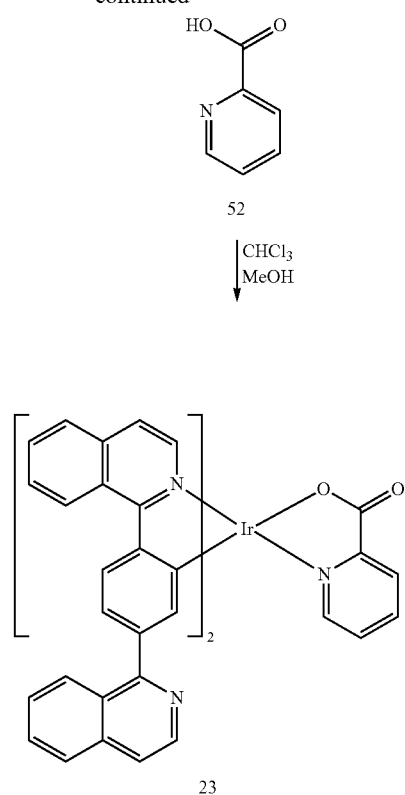

As illustrated in Reaction Scheme 5, the compound represented by Formula 23 was synthesized in the same manner as in Example 1, except that picolinic acid of Formula 52 was used instead of 4-hydroxy-pent-3-ene-2-one of Formula 51.

Example 4

Synthesis of Compound Represented by Formula 24

<Reaction Scheme 6>

As illustrated in Reaction Scheme 6, the compound represented by Formula 24 was synthesized in the same manner as in Example 1, except that 4-butyl-picolinic acid of Formula 53 was used instead of 4-hydroxy-pent-3-ene-2-one of Formula 51.

Comparative Example 1

The compound represented by Formula 61 was used.

<Formula 61>

The compounds represented by Formulas 21 through 24 obtained according to Examples 1 through 4 and the compound represented by Formula 61 in Comparative Example 1 were dissolved in methylene chloride to prepare $10^{-4}$ M solutions, and photoluminescence characteristics of these solutions were measured. In addition, such solutions were spin coated on a neat film and photoluminescence characteristics of the coated films were measured.

The photoluminescence characteristics and color coordinates (CIE) of these compounds are shown in Table 1:

TABLE 1
| | PL characteristic $\lambda_{max}$ (nm) | | CIE (x, y) | |
|---|---|---|---|---|
| | Solution | Film | Solution | Film |
| Example 1: 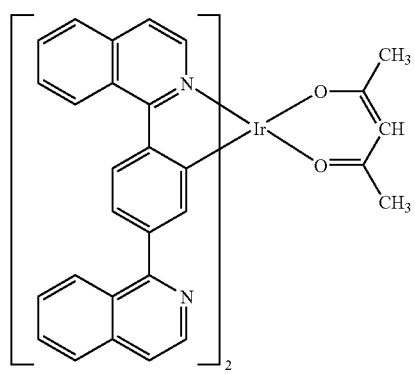 | 646 | — | (0.69, 0.30) | — |
| Example 2: 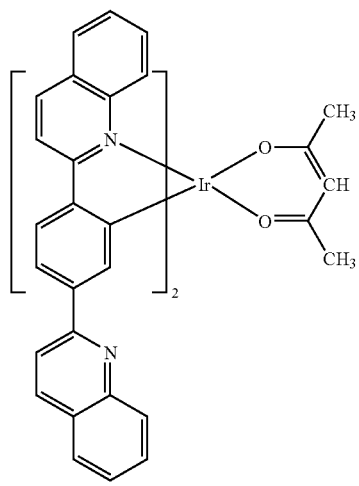 | 618 | 631 | (0.65, 0.34) | (0.67, 0.32) |
| Example 3 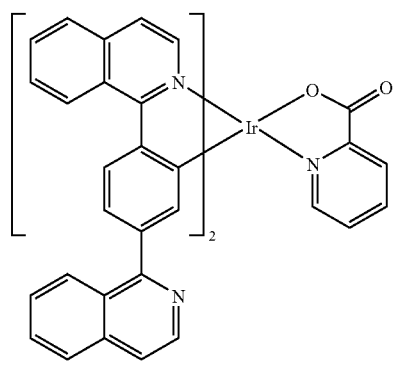 | 631 | — | (0.66, 0.33) | — |

TABLE 1-continued

| | PL characteristic $\lambda_{max}$ (nm) | | CIE (x, y) | |
|---|---|---|---|---|
| | Solution | Film | Solution | Film |
| Example 4 | 635 | — | (0.66, 0.33) | — |
| Comparative Example 1 | 635 | — | — | — |

As illustrated in Table 1, dopants containing new cyclometalating ligand having excellent phosphorescent characteristics are formed. In particular, the introduction of the quinolinic substituent results in a strong electronic effect, and thus, the dopant is suitable to be used to form a phosphorescent material that emits light of a wavelength corresponding to red light.

In particular, thermogravimetry was performed on organometallic complexes obtained in Examples 1, 2 and 4. The results show that the decomposition temperatures of these organometallic complexes are 305° C., 310° C., and 339° C., respectively, showing excellent thermal stability. Such thermal stability has an excellent property which endures plasticity while a device is manufactured.

Manufacture of Organic Electroluminescent (EL) Devices

Example 5

An indium-tin oxide (ITO)-coated transparent electrode substrate was washed and an ITO electrode pattern was formed on the substrate using a photoresist resin and an etchant. The ITO electrode patterned substrate was again washed. PEDOT{poly(3,4-ethylenedioxythiophene)}[Al 4083] was coated on the washed ITO electrode patterned substrate to a thickness of about 50 nm and baked at 120° C. for about 5 minutes to form a hole injection layer.

A mixture solution, which was prepared by mixing PVK, CBP (PVK:CBP=4:5) and 5% by weight of the dopant of Formula 21 with chloroform was spin coated on the hole injection layer to form a light emitting layer with a thickness of 85 nm. Then, aluminum(III)bis(2-methyl-8-quinolinato)$_4$-phenylphenolate (Balq) was vacuum deposited to a thickness of 30 nm on the polymer light emitting layer using a vacuum deposition device under a pressure of $4\times10^{-6}$ torr or less and 8-tris-hydroxyquinoline aluminum (Alq$_3$) was vacuum deposited to form an electron transport layer with a thickness of 15 nm. Then, LiF was vacuum deposited on the electron transport layer at a speed of 0.1 Å/sec to form an electron injection layer with a thickness of 0.8 nm.

Figure 2:
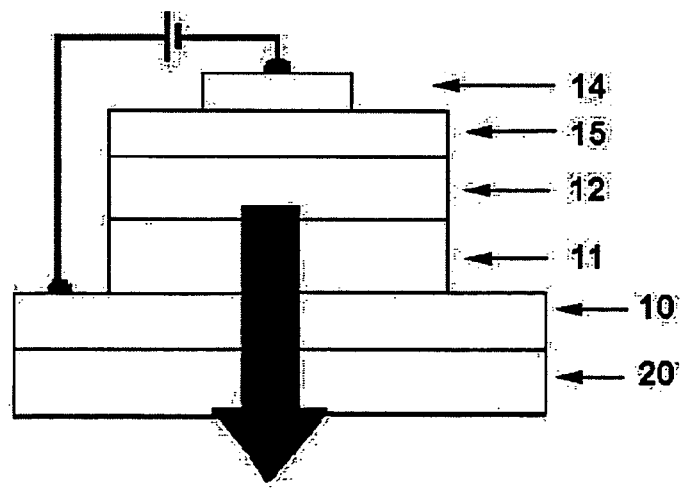
FIG. 2 is a diagram illustrating an organic electroluminescent device manufactured according to the present invention.

Subsequently, Al was deposited at a speed of 10 Å/sec to form an anode with a thickness of 150 nm and the resultant structure was encapsulated, thereby completing manufacture of an organic EL device. Here, the encapsulating process was performed by sealing the resultant structure of the Al deposition in a glove box in which BaO powder was present in a dry nitrogen gas atmosphere and by final treating using a UV hardener. The structure of the device is ITO/PEDOT-PSS (60 nm)/PVK-CBP (4:5)-dopant 5% by weight (85 nm)/Balq (20 nm)/Alq (15 nm)/LiF (0.8 nm)/Al (150 nm). FIG. 2 is a diagram illustrating the organic EL device manufactured as described above according to an embodiment of the present invention. The organic EL device had a multi-layer structure and its schematic view is illustrated in FIG. 2. In this case, the light emitting area of the organic EL device was 6 mm².

Example 6

An organic EL device was manufactured in the same manner as in Example 5, except that the compound represented by Formula 22 (synthesized in Example 2) was used instead of the compound represented by Formula 21 (synthesized in Example 1).

Example 7

An organic EL device was manufactured in the same manner as in Example 5, except that the compound represented by Formula 23 (synthesized in Example 3) was used instead of the compound represented by Formula 21 (synthesized in Example 1).

Example 8

An organic EL device was manufactured in the same manner as in Example 5, except that the compound represented by Formula 22 (synthesized in Example 2) was used instead of the compound represented by Formula 21 (synthesized in Example 1).

Comparative Example 2

An organic EL device was manufactured in the same manner as in Example 5, except that the compound represented by Formula 61 (in Comparative Example 1) was used instead of the compound represented by Formula 21 (synthesized in Example 1).

The current efficiency, operating voltage, and brightness of organic electroluminescent (EL) devices obtained in Examples 5 and 6 and Comparative Example 2 are shown in Table 2

TABLE 2

| | Current efficiency (cd/A) | Operating voltage (V) | Maximum brightness (cd/m²) |
|---|---|---|---|
| Example 5 | 1.3 at 11 V | 7.0 | 2325 |
| Example 6 | 0.82 at 13 V | 7.0 | 1336 |
| Comparative Example 2 | 0.10 at 10 V | 7.0 | 300 |

As illustrated in Table 2, the organic EL devices of Examples 5 and 6 including compounds according to the present invention shows high brightness in a wavelength corresponding to red light emitting region and high current density even at a low voltage, and can even operate at a low voltage.

An organometallic complex according to the present invention can effectively emit light of a wavelength corresponding to red light. The organometallic complex is suitable to form an organic layer of an organic EL device, and efficiently emits light in a wavelength region of 550 to 650 nm as efficient phosphorescent materials. In addition, when the organometallic complex is used with a green phosphorescent material or a blue phosphorescent material, white light can be emitted.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organometallic complex represented by Formula 1:

ML₂L'     (1)

where M is Ir;

L₂ and L' are different bidentate ligands; and

ML₂ of Formula 1 is represented by one of Formulas 4, 5, and 7 through 9:

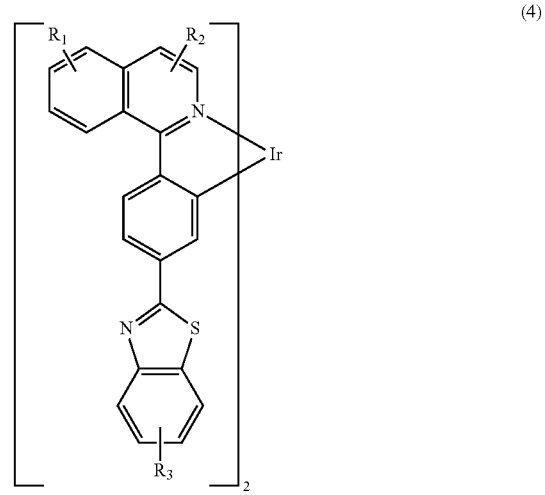

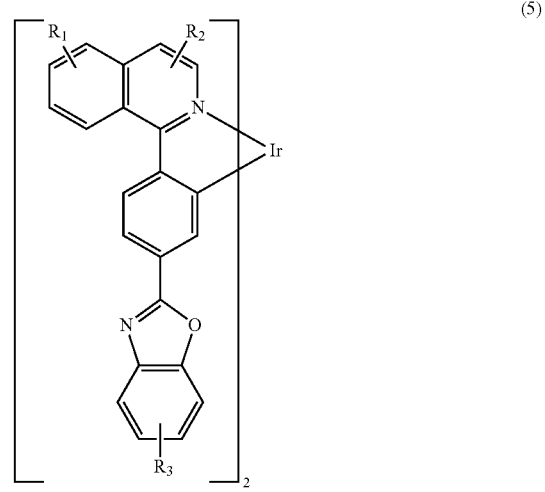

-continued (7)
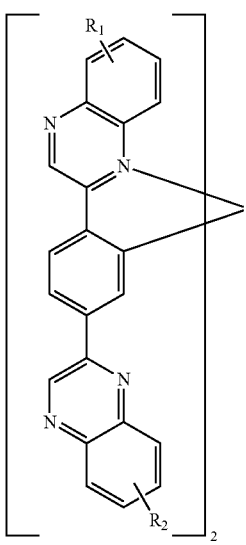

(8)
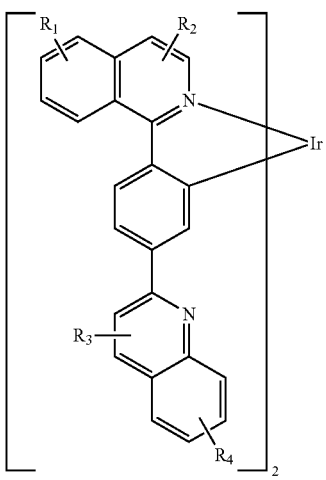

(9)
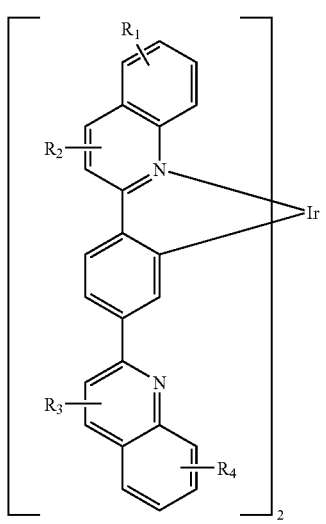

where, $R_1$, $R_2$, $R_3$ and $R_4$ are each independently at least one selected from the group consisting of hydrogen, a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, and a substituted or unsubstituted $C_3$-$C_{30}$ heteroarylalkyl group.

2. The organometallic complex of claim 1, wherein the bidentate ligand L' is represented by one of Formulas 11 through 19:

(11)
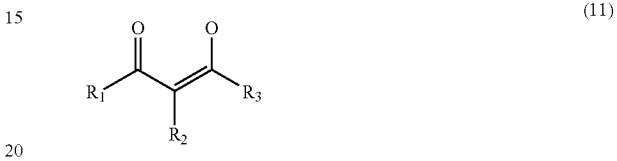

(12)
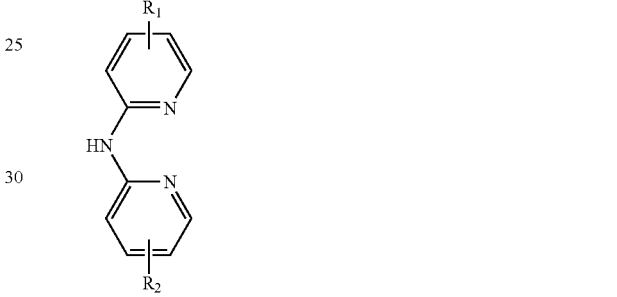

(13)

(14)

(15)

-continued

(16)
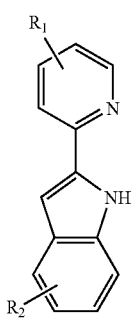

(17)
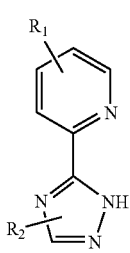

(18)
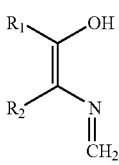

(19)
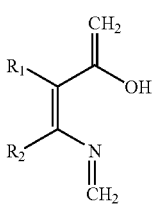

where, $R_1$, $R_2$, $R_3$ and $R_4$ are each independently at least one selected from the group consisting of a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl, a substituted or unsubstituted $C_1$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, and a substituted or unsubstituted $C_3$-$C_{30}$ heteroarylalkyl group.

3. The organometallic complex of claim 1, wherein the compound represented by Formula 1 is represented by one of Formulas 22, 25, 26 or 28:

(22)
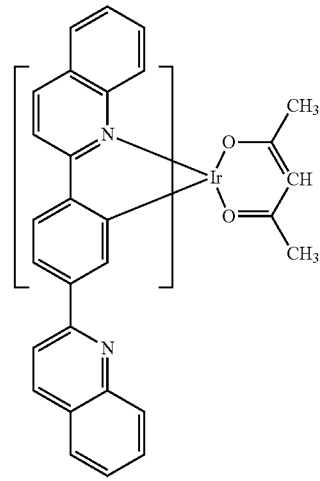

(25)
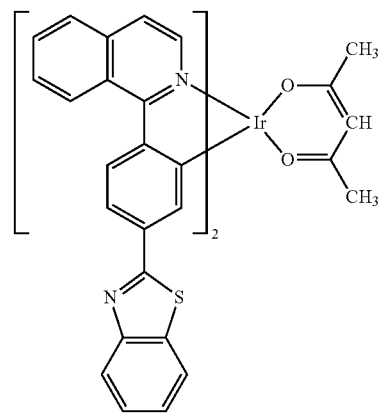

(26)
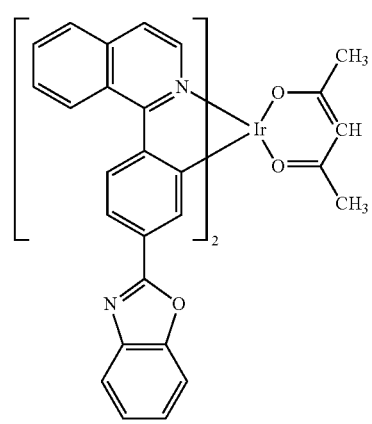

(28)
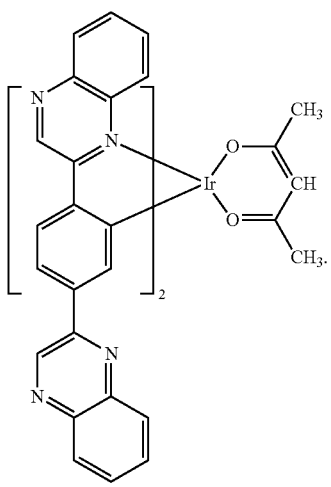
4. An organic electroluminescence device including an organic layer comprising an organometallic complex of claim 1.
5. An organometallic complex represented by Formula 1:
$$ML_2L' \quad (1)$$
where M is Ir;
$L_2$ and $L'$ are different bidentate ligands; and
$ML_2$ of Formula 1 is represented by one of Formulas 4, 5, and 7 through 9:
(4)
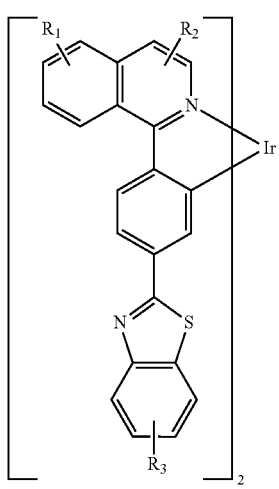
(5)
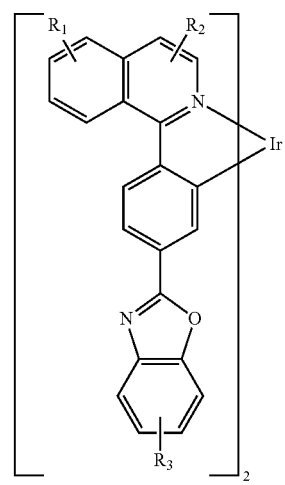
(7)
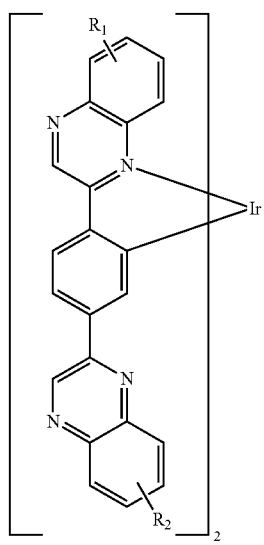
(8)
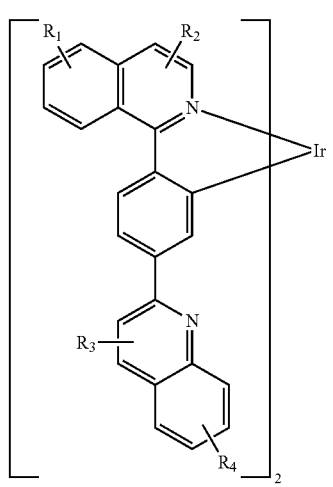

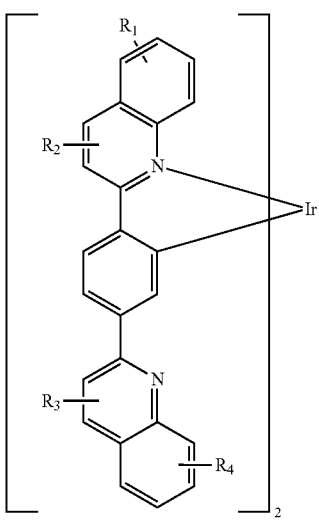 (9)

where, $R_1$, $R_2$, $R_3$ and $R_4$ are each independently at least one selected from the group consisting of hydrogen, a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, and a substituted or unsubstituted $C_3$-$C_{30}$ heteroarylalkyl group; and L' is represented by Formulas 11 through 19:

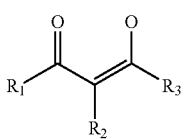 (11)

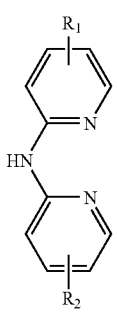 (12)

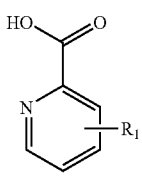 (13)

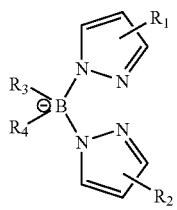 (14)

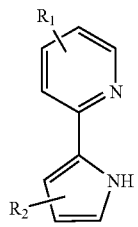 (15)

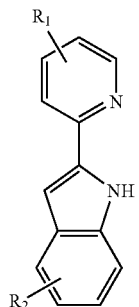 (16)

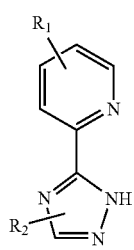 (17)

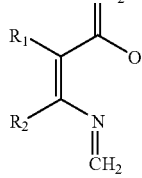 (18)

 (19)

where, $R_1$, $R_2$, $R_3$ and $R_4$ are each independently at least one selected from the group consisting of a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, and a substituted or unsubstituted $C_3$-$C_{30}$ heteroarylalkyl group.

6. An organic electroluminescence device having an organic layer comprising an organometallic complex of claim 5.

7. An organic electroluminescence device, comprising:

a pair of electrodes; and an organic layer interposed between the pair of electrodes, the organic layer comprising an organometallic complex represented by Formula 1:

$$ML_2L' \qquad (1)$$

where M is Ir;

$L_2$ and L' are different bidentate ligands; and $ML_2$ of Formula 1 is represented by one of Formulas 4, 5, and 7 through 9:

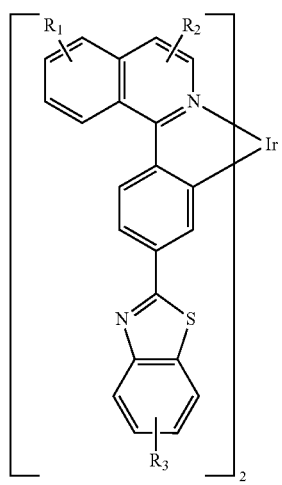

(4)

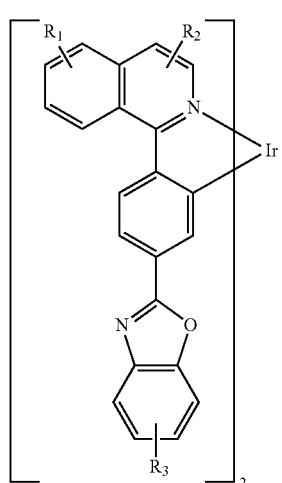

(5)

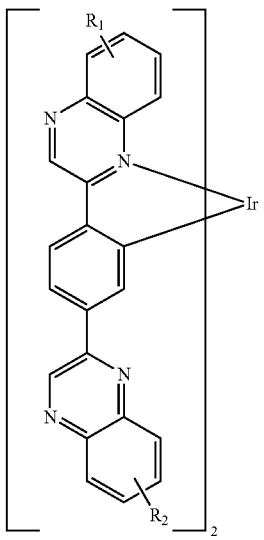

(7)

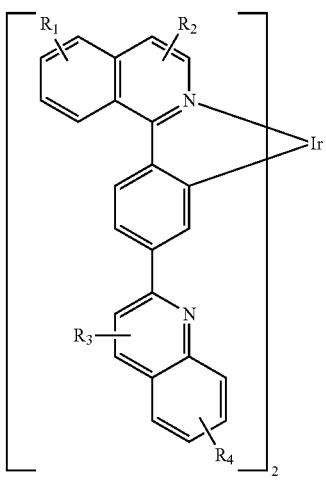

(8)

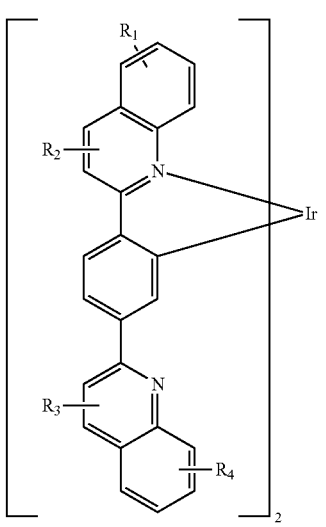

(9)

where, $R_1$, $R_2$, $R_3$ and $R_4$ are each independently at least one selected from the group consisting of hydrogen, a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, and a substituted or unsubstituted $C_3$-$C_{30}$ heteroarylalkyl group.

8. The organic electroluminescence device of claim 7, wherein the organic layer comprising an organometallic complex of Formula (1) is a light emitting layer.

9. The organic electroluminescence device of claim 8, wherein the organometallic complex is in an amount of 1 to 30 parts by weight based on 100 parts by weight of all the materials used to form the light emitting layer.

10. The organic electroluminescence device of claim 7, wherein the organic layer further comprises one of green phosphorescent materials or blue phosphorescent materials.

11. The organic electroluminescence device of claim 7, wherein the bidentate ligand L' is represented by one of Formulas 11 through 19:

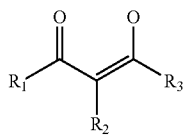
(11)

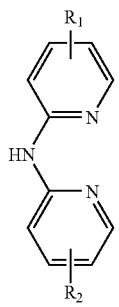
(12)

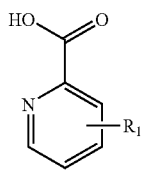
(13)

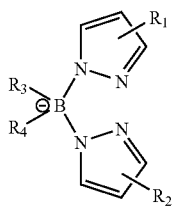
(14)

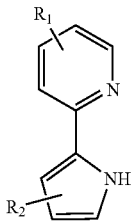
(15)

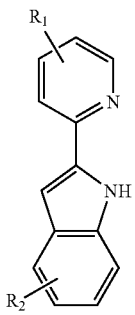
(16)

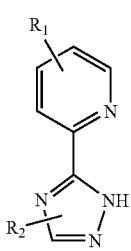
(17)

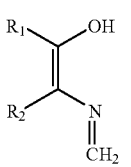
(18)

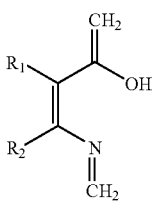
(19)

where, $R_1$, $R_2$, $R_3$ and $R_4$ are each independently at least one selected from the group consisting of a halogen atom, a carboxyl group, an amino group, a nitro group, a cyano group, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl, a substituted or unsubstituted $C_2$-$C_{20}$ alkynyl group, a substituted or unsubstituted $C_1$-$C_{20}$ heteroalkyl group, a substituted or unsubstituted $C_6$-$C_{30}$ aryl group, a substituted or unsubstituted $C_7$-$C_{30}$ arylalkyl group, a substituted or unsubstituted $C_5$-$C_{30}$ heteroaryl group, and a substituted or unsubstituted $C_3$-$C_{30}$ heteroarylalkyl group.

12. The organic electroluminescence device of claim 7, wherein the compound represented by Formula 1 is represented by one of Formulas 22, 25, 26 or 28:

(22)
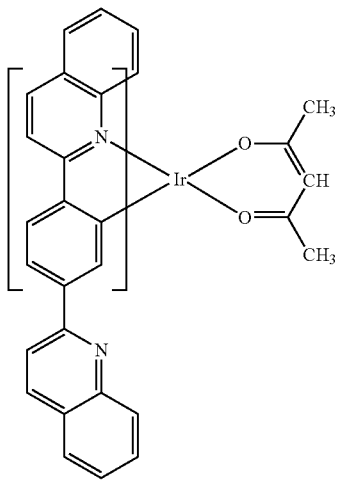
(25)
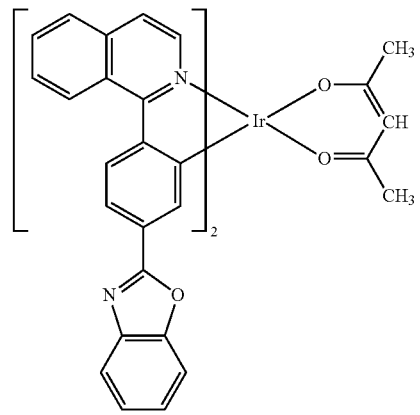
(26)
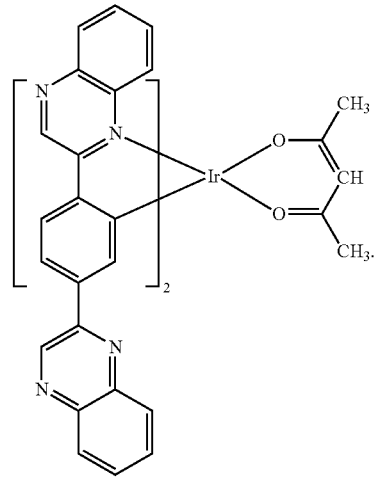
(28)
13. The organic electroluminescence device of claim 7, wherein the organic layer further comprises at least one host selected from the group consisting of a polymer host, a mixture host comprising a polymer and a small molecule, a small molecule host, and a non-emitting polymer matrix.
* * * * *